United States Patent
Kang et al.

(10) Patent No.: US 7,643,336 B2
(45) Date of Patent: Jan. 5, 2010

(54) PHASE CHANGE MEMORY DEVICE

(75) Inventors: Hee Bok Kang, Cheongju-si (KR); Jin Hong An, Yongin-si (KR); Suk Kyoung Hong, Gwacheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 22 days.

(21) Appl. No.: 11/987,758

(22) Filed: Dec. 4, 2007

(65) Prior Publication Data

US 2009/0043973 A1     Feb. 12, 2009

(30) Foreign Application Priority Data

Aug. 10, 2007   (KR) ...................... 10-2007-0080667

(51) Int. Cl.
    *G11C 11/00*     (2006.01)
(52) U.S. Cl. .............. 365/163; 365/189.07; 365/189.14
(58) Field of Classification Search ................ 365/163, 365/189.07, 189.14–189.16, 148
    See application file for complete search history.

(56) References Cited

U.S. PATENT DOCUMENTS 7,242,605 B2 *  7/2007 Choi et al. ................. 365/148
7,295,464 B2 * 11/2007 Cho et al. .................. 365/163
7,443,721 B2 * 10/2008 Kurotsuchi et al. ......... 365/163
2009/0040813 A1 *  2/2009 Kang et al. ................. 365/163
2009/0040816 A1 *  2/2009 Kang et al. ................. 365/163
2009/0040817 A1 *  2/2009 Kang et al. ................. 365/163

FOREIGN PATENT DOCUMENTS

KR          100764738 B1       10/2007

* cited by examiner

*Primary Examiner*—David Lam
(74) *Attorney, Agent, or Firm*—Ladas & Parry LLP

(57) ABSTRACT

A phase change memory device comprises a cell array unit including a phase change resistance cell disposed in a region where a word line and a bit line are crossed, a sense amplifier configured to sense and amplify data of the phase change resistance cell, a write driving unit configured to supply a write voltage corresponding to data to be written in the cell array unit in response to an enabling signal, and a write verifying control unit controlled by an activation control signal and configured to compare data read through the sense amplifier with the data to be written so as to output the enabling signal.

20 Claims, 10 Drawing Sheets ly*.

PHASE CHANGE MEMORY DEVICE

This application is based upon and claims the benefit of priority to Korean Patent Application No. 10-2007-0080667, filed on Aug. 10, 2007, which is incorporated by reference in its entirety, is claimed.

TECHNICAL FIELD

The present invention generally relates to a phase change memory device, and more specifically, to a technology of performing a write verifying operation in a write mode to write data stably in cells.

BACKGROUND

Generally, nonvolatile memories such as magnetic memory and phase change memory (PCM) have a data processing speed of a random access memory (RAM), and a data preserving characteristic even when a power source is off.

FIGS. 1a and 1b are diagrams illustrating a conventional phase change resistor (PCR). A PCR 4 includes a phase change material (PCM) 2 inserted between an upper electrode 1 and a lower electrode 3. When a voltage and a current are applied, a high temperature is induced to the PCM 2 so that an electric conductive state is changed depending on resistance change.

The PCM 2 includes AgInSbTe. As a material of the PCM 2, Chalcogenide having S, Se and Te of chalcogen as a main ingredient, can be used. Specifically, germanium antimony tellurium alloy (Ge2Sb2Te5) consisting of Ge—Sb—Te is used.

FIGS. 2a and 2b are diagrams illustrating a principle of the conventional PCR. As shown in FIG. 2a, when a low current of less than a critical value flows in the PCR 4, the PCM 2 has a proper temperature to be crystallized. As a result, the PCM 2 enters a crystalline phase to become a low resistance material.

As shown in FIG. 2b, when a high current of more than a critical value flows in the PCR 4, the PCM 2 has a temperature over a melting point. As a result, the PCM 2 enters an amorphous phase to become a high resistance material.

The PCR 4 can store nonvolatile data corresponding to the two resistance states. That is, logic states of two data can be stored if when the PCR 4 is in a low resistance state is data "1" and when the PCR 4 is in a high resistance state is data "0".

FIG. 3 is a diagram illustrating a write operation of the conventional PCR. When a current flows between the upper electrode 1 and the lower electrode 3 of the PCR 4 for a given time, a high heat is generated. As a result, the PCM 2 becomes crystallized and amorphous by a state of temperature applied to the upper electrode 1 and the lower electrode 3.

When a low current flows for a given time, the PCM 2 becomes crystallized by a low heating state so that the PCR 4 which is a low resistor enters a set phase. When a high current flows for a given time, the PCM 2 becomes amorphous by a high heating state so that the PCR 4 which is a high resistor enters a reset phase. As a result, a difference of the two phases is represented as an electric resistance change.

In order to write the set state in a write mode, a low voltage is applied to the PCR 4 for a long time. On the other hand, in order to write the reset state in the write mode, a high voltage is applied to the PCR 4 for a short time.

SUMMARY

Disclosed is a phase change memory device configured to perform a write verifying operation so as to write data stably in cells.

Various embodiments consistent with the invention are directed at providing a phase change memory device configured to control write modes of set and reset states, respectively.

Various embodiments consistent with the invention are directed at providing a phase change memory device configured to share a set write driving unit in a write mode of the reset state so as to reduce power consumption.

According to an embodiment consistent with the invention, a phase change memory device comprises a cell array unit including a phase change resistance cell disposed in a region where a word line and a bit line are crossed, a sense amplifier configured to sense and amplify data of the phase change resistance cell, a write driving unit configured to supply a write voltage corresponding to data to be written in the cell array unit in response to an enabling signal, and a write verifying control unit controlled by an activation control signal and configured to compare data read through the sense amplifier with the data to be written so as to output the enabling signal.

DETAILED DESCRIPTION

Figure 1A:
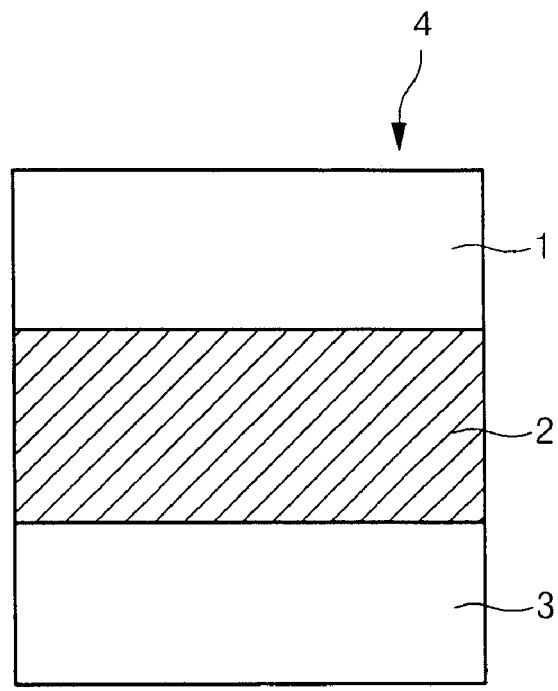
FIGS. 1a and 1b are diagrams illustrating a conventional phase change resistor (PCR).
Figure 1B:
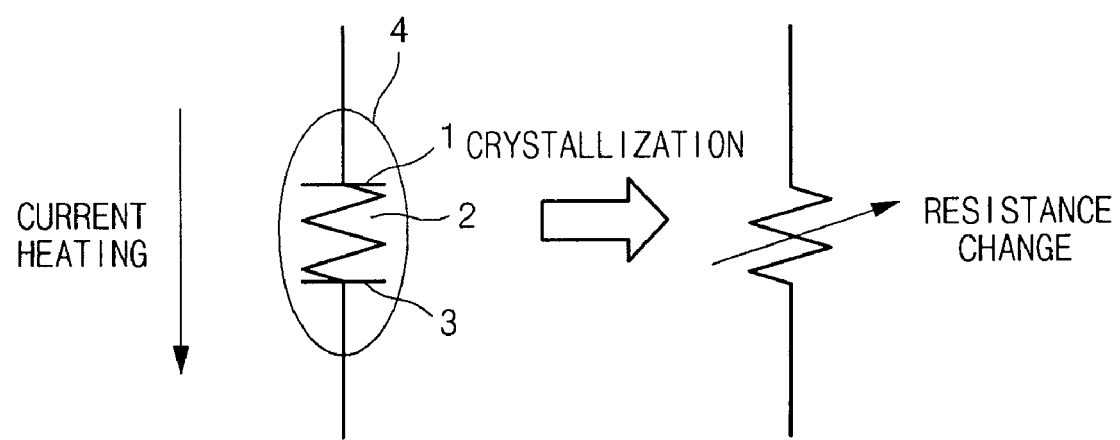
Figure 2A:
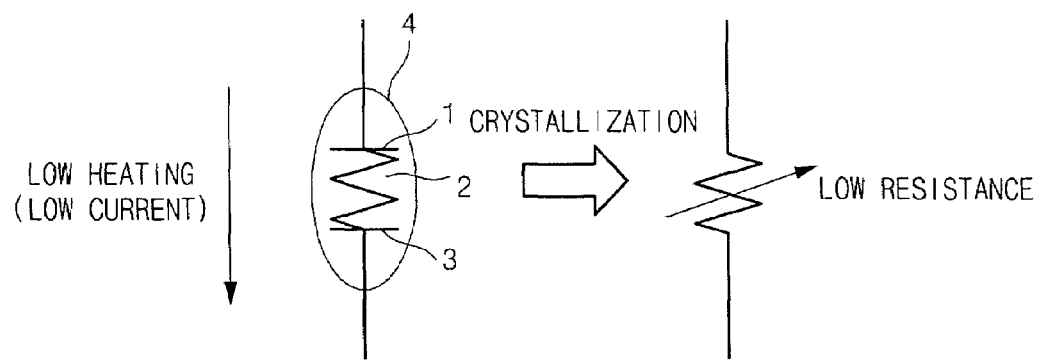
FIGS. 2a and 2b are diagrams illustrating a principle of the conventional PCR.
Figure 2B:
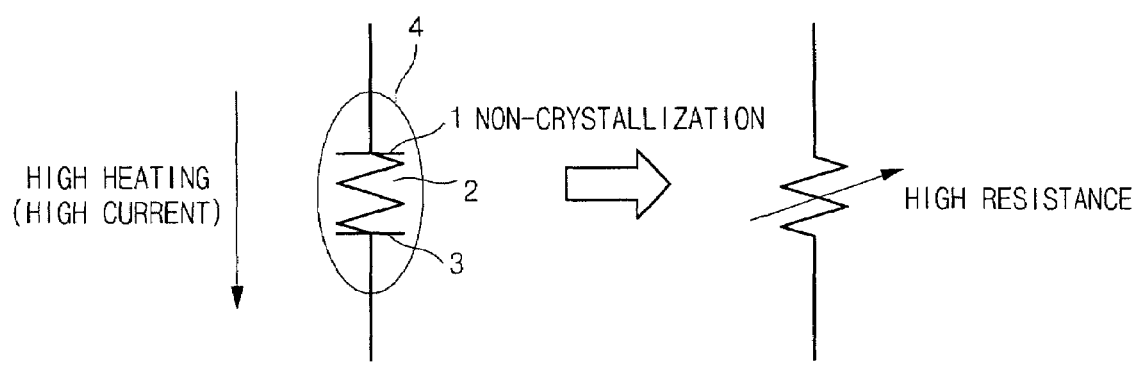
Figure 3:
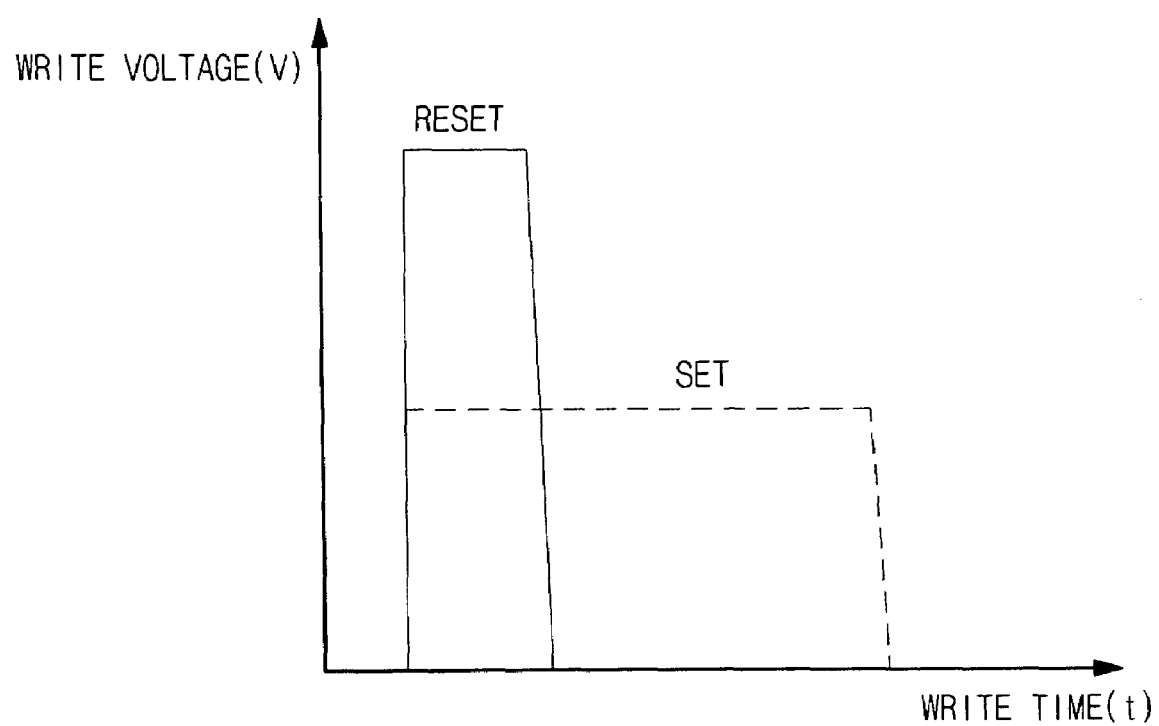
FIG. 3 is a diagram illustrating a write operation of the conventional PCR.
Figure 4:
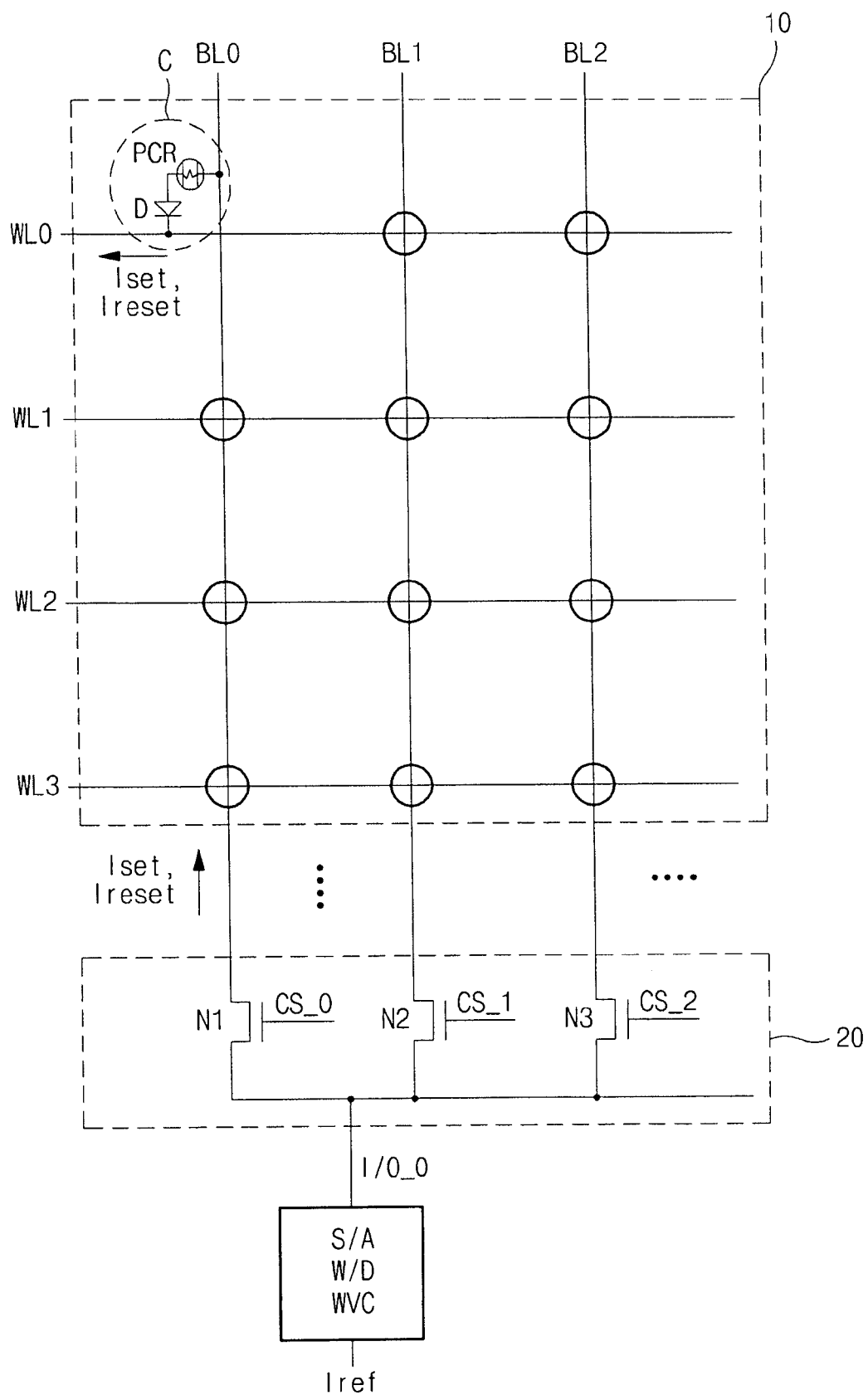
FIG. 4 is a circuit diagram illustrating a phase change memory device according to an embodiment of the invention.

FIG. 4 is a circuit diagram illustrating a phase change memory device according to an embodiment of the invention. A phase change memory device includes a cell array unit 10, a column selecting unit 20, a sense amplifier S/A, a write driving unit W/D and a write verifying control unit WVC.

The cell array unit 10 includes a plurality of bit lines BL0~BL2 arranged in a column direction and a plurality of word lines WL0~WL3 arranged in a row direction. The cell array unit 10 includes a unit phase change resistance cell C disposed in a region where the bit lines BL0~BL2 are crossed with the word lines WL0~WL3. The unit phase change resistance cell C includes a phase change resistor (PCR) and a PN diode D.

One side of the PCR is connected to a word line WL, and the other side of the PCR is connected to a N-type region of the PN diode D. A P-type region of the PN diode D is connected to a bit line BL, and the N-type region of the PN diode D is connected to the word line WL. A phase of the PCR is changed depending on a set current Iset and a reset current Ireset flowing in each bit line BL to write data.

The column selecting unit 20 includes a plurality of switching elements connected between each bit line BL0~BL2 and an input/output line I/O_0 of the cell array unit 10. Each of the switching elements has a gate to receive a plurality of column selecting signals CS_0~CS_2. The plurality of switching elements include NMOS transistors N1~N3.

The sense amplifier S/A compares a reference current Iref with cell data applied through the input/output line I/O_0 to distinguish reset data from set data. The write driving unit W/D supplies a write voltage corresponding to write data to the input/output line I/O_0 when data are written in cells. The write verifying control unit WVC controls the write driving unit W/D depending on whether data written in cells are the same as that applied to the input/output line I/O_0.

Figure 5:
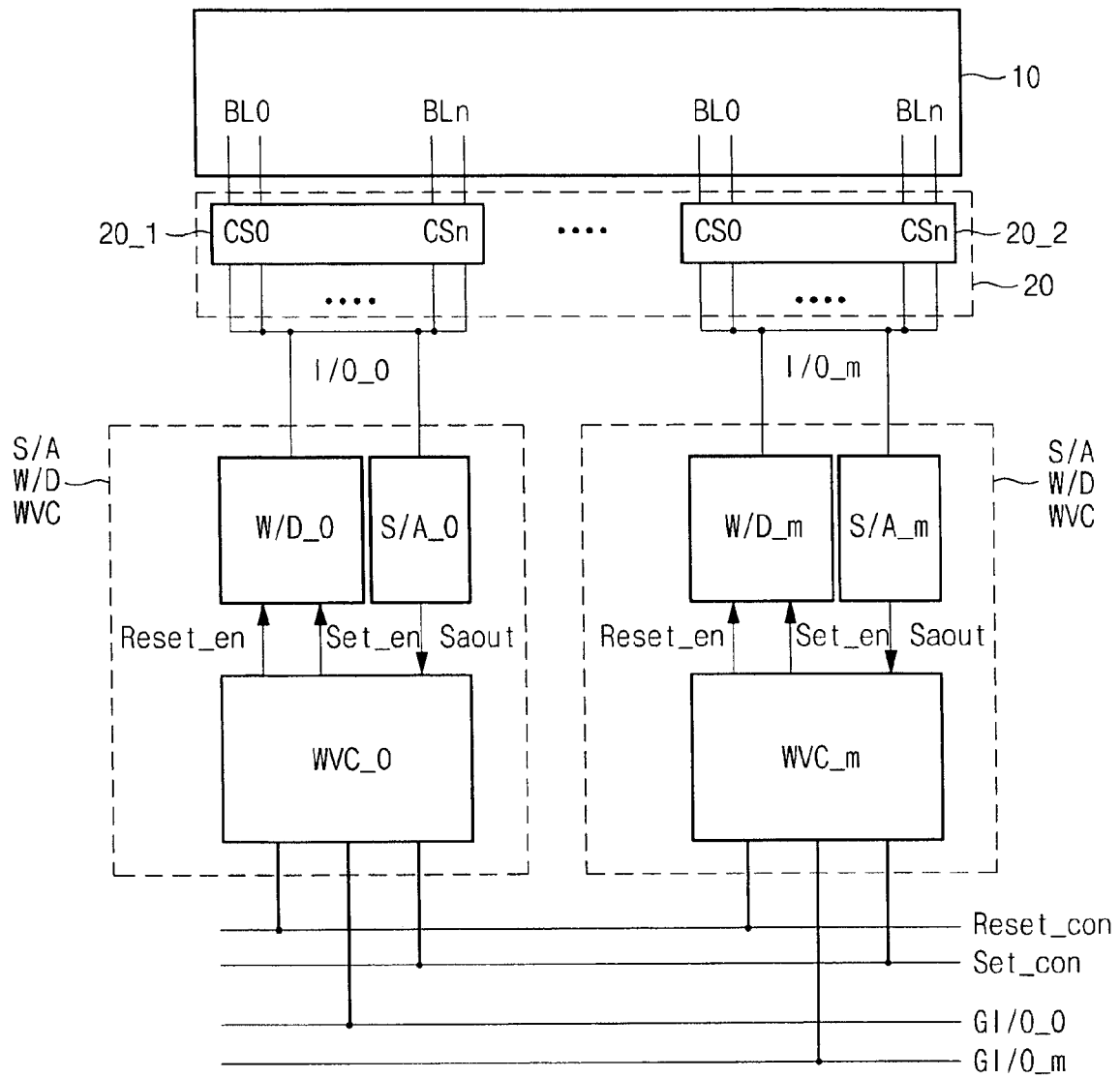
FIG. 5 is a block diagram illustrating a phase change memory device according to an embodiment of the invention.

FIG. 5 is a block diagram illustrating a phase change memory device according to an embodiment of the invention. A phase change memory device includes a cell array unit 10, a column selecting unit 20, a sense amplifier S/A, a write driving unit W/D and a write verifying control unit WVC.

A column selecting unit 20_1 has one side connected one by one to bit lines BL0~BLn of the cell array unit 10, and the other side connected in common to the input/output line I/O_0. A column selecting unit 20_2 has one side connected one by one to bit lines BL0~BLn of the cell array unit 10, and the other side connected in common to the input/output line I/O_m.

A sense amplifier S/A_0 and a write driving unit W/D_0 are connected to the input/output line I/O_0, respectively. A sense amplifier S/A_m and a write driving unit W/D_m are connected to the input/output line I/O_m, respectively.

In response to a reset activation control signal Reset_con and a set activation control signal Set_con, a write verifying control unit WVC_0 compares an output signal Saout of the sense amplifier S/A with data of a global input/output line GI/O_0 to output a reset enable signal Reset_en and a set enabling signal Set_en.

In response to the reset activation control signal Reset_con and the set activation control signal Set_con, a write verifying control unit WVC_m compares the output signal Saout of the sense amplifier S/A with data of a global input/output line GI/O_m to output the reset enabling signal Reset_en and the set enabling signal Set_en.

Terms on set data, reset data and signal levels of the global input/output line GI/O are defined as shown in Table 1.

TABLE 1

| Terms | Set data | Reset data |
| --- | --- | --- |
| Definition | Data "0" | Data "1" |
| Signal level of Global input/output line GI/O | 0 | 1 |

That is, the set data is defined as data "0", which means a logic state "0". The reset data is defined as data "1", which means a logic state "1".

Figure 6:
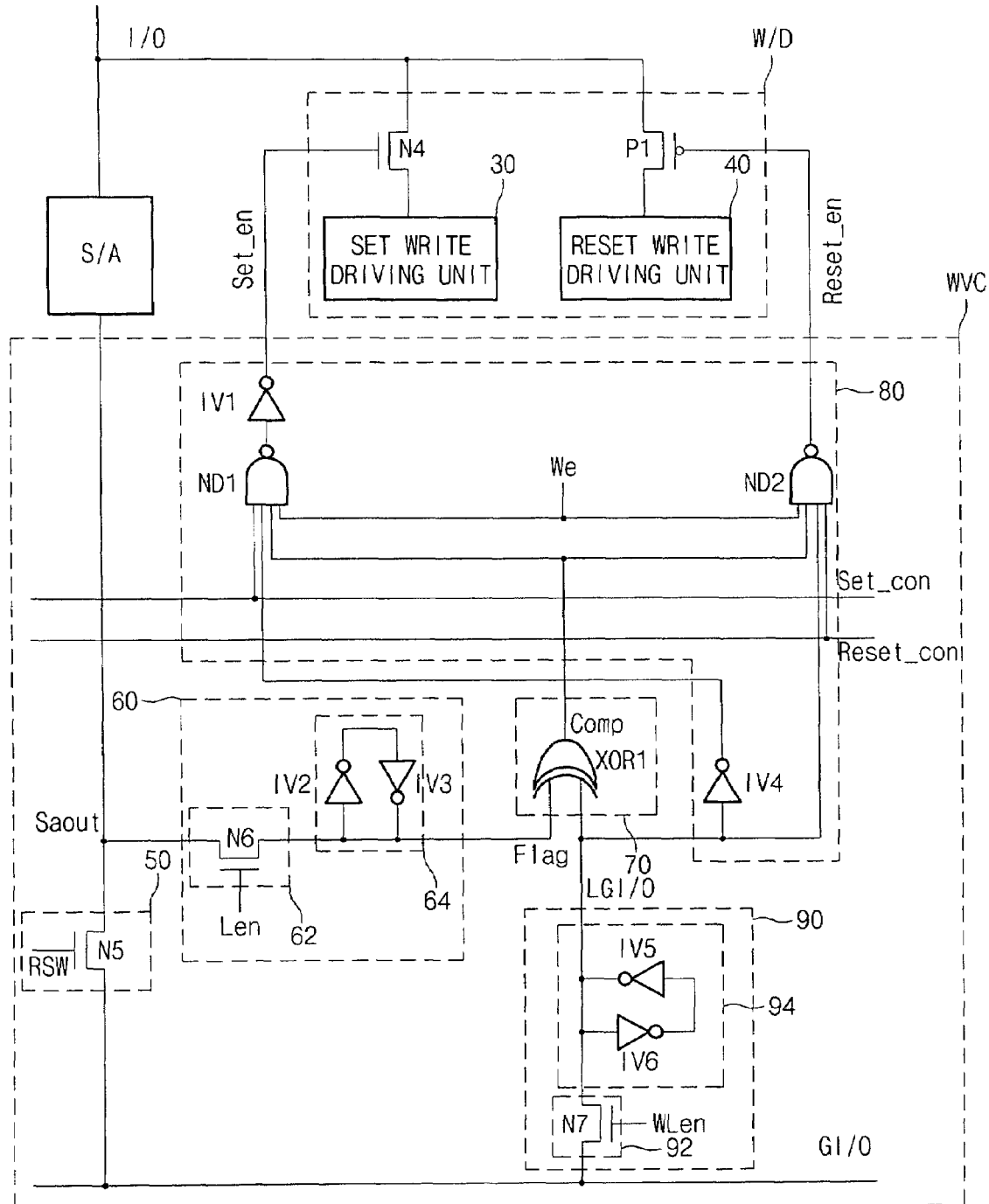
FIG. 6 is a circuit diagram illustrating a sense amplifier, a write driving unit and a write verifying control unit according to an embodiment of the invention.

FIG. 6 is a circuit diagram illustrating a sense amplifier S/A, a write driving unit W/D and a write verifying control unit WVC according to an embodiment of the invention.

The sense amplifier S/A compares a reference current Iref with cell data applied through the input/output line I/O_m to output the output signal Saout.

The write driving unit W/D includes a NMOS transistor N4, a PMOS transistor P1, a set write driving unit 30 and a reset write driving unit 40.

The NMOS transistor N4, connected between the input/output line I/O and the set write driving unit 30, has a gate to receive the set enabling signal Set_en. The PMOS transistor P1, connected between the input/output line I/O and the reset write driving unit 40, has a gate to receive the reset enabling signal Reset_en.

The set write driving unit 30 supplies a write voltage corresponding to set data to the input/output line I/O in a write mode. The reset write driving unit 40 supplies the write voltage corresponding to reset data to the input/output line I/O in the write mode.

The write verifying control unit WVC includes a sense amplifier switching unit 50, a flag register 60, a comparison unit 70, an enabling signal generating unit 80 and a data latch unit 90.

The sense amplifier switching unit 50 includes a NMOS transistor N5. The NMOS transistor N5, connected between an output Saout receiving terminal of the sense amplifier S/A and the global input/output line GI/O, has a gate to receive a read switching signal RSW.

The flag register 60 includes a transfer unit 62 and a latch 64. The transfer unit 62 includes a NMOS transistor N6. The NMOS transistor N6, connected between the output Saout receiving terminal of the sense amplifier S/A and the latch 64, has a gate to receive a latch enabling signal Len.

The latch 64 includes inverters IV2 and IV3. The inverter IV2 inverts an output signal of the transfer unit 62. The inverter IV3 inverts an output signal of the inverter IV2 to output a flag signal Flag that has the same polarity as that of data outputted from the sense amplifier S/A.

The comparison unit 70 includes an exclusive OR gate XOR1. The exclusive OR gate XOR1 performs an exclusive OR operation on the flag signal Flag and data of a latch global input/output line LGI/O to output a comparison signal Comp.

The enabling signal generating unit 80 includes NAND gates ND1, ND2, and inverters IV1, IV4. The NAND gate ND1 performs a NAND operation on the set activation control signal Set_con, an output signal of the inverter IV4, a write enabling signal We and the comparison signal Comp.

The NAND gate ND2 performs a NAND operation on the reset activation control signal Reset_con, data of the latch glable input/output line LGI/O, the write enabling signal We and the comparison signal Comp to output the reset enabling signal Reset_en.

The inverter IV1 inverts an output signal of the NAND gate ND1 to output the set enabling signal Set_en. The inverter IV4 inverts the data of the latch global input/output line LGI/O.

The data latch unit 90 includes a transfer unit 92 and a latch 94. The transfer unit 92 includes a NMOS transistor N7. The NMOS transistor N7, connected between the latch 94 and the global input/output line GI/O, has a gate to receive a write latch enabling signal WLen.

The latch 94 includes inverters IV5 and IV6. The inverter IV5 inverts an output signal of the inverter IV6 to output the output signal to the latch global input/output line LGI/O. The inverter IV6 inverts an output signal of the transfer 92.

Table 2 shows the operations of the sense amplifier S/A, the write driving unit W/D and the write verifying control unit WVC.

TABLE 2

| Global input/output line GI/O | Flag signal Flag | Comparison signal Comp | Set enabling signal Set_en | Reset enabling signal Reset_en |
|---|---|---|---|---|
| Set data | Set data | 0 | Inactivated | Inactivated |
| Reset data | Reset data | 0 | Inactivated | Inactivated |
| Set data | Reset data | 1 | Activated | Inactivated |
| Reset data | Set data | 1 | Inactivated | Activated |

When data of the selected cell C is transmitted into the input/output line I/O, the sense amplifier S/A senses and amplifies data of the selected cell C to output the output signal Saout. A read switching signal RSW remains inactivated at a low level. As a result, the NMOS transistor N5 maintains a turn-off state.

The latch enabling signal Len becomes activated at a high level. The NMOS transistor N6 is turned on so that an output signal Saout of the sense amplifier S/A is transmitted into the latch 64. The latch 64 latches the output signal Saout of the sense amplifier to output signal the flag signal Flag.

The write latch enable signal WLen is activated at a high level. The NMOS transistor N7 is turned on, the data of the global input/output line GI/O is transmitted into the latch 94. The latch 94 latches the data of the global input/output line GI/O to output the data to the latch global input/output line LGI/O.

The exclusive OR gate XOR1 performs an exclusive OR operation on the flag signal Flag and the data of the latch global input/output line LGI/O to output the comparison signal Comp. When the data of the latch global input/output line LGI/O is the same as the flag signal Flag, the comparison signal Comp is outputted at a low level. When the data of the latch global input/output line LGI/O is different from the flag signal Flag, the comparison signal Comp is outputted at a high level.

When the comparison signal Comp is outputted at the low level, the set enabling signal Set_en is inactivated at a low level and the reset enabling signal Reset_en is inactivated at a high level. The write voltage outputted from the set write driving unit 30 and the reset write driving unit 40 is not applied to the input/output line I/O. When the data stored in the selected cell C is the same as the data to be written, a new write operation is not performed but a write cycle is finished, thereby reducing the number of write operations of the reset and set modes.

When the comparison signal Comp is outputted at a high level, the set write operation and the reset write mode operation are performed, respectively. In the set write mode, the set activation control signal Set_con is activated at a high level. The write enabling signal We remains activated at the high level, and the reset activation control signal Reset_con remains inactivated at the low level.

When the data of the global input/output line GI/O is set data, the set enabling signal Set_en is activated at a high level. As a result, the NMOS transistor N4 is turned on so that the write voltage outputted from the set write driving unit 30 is transmitted into the input/output line I/O. The set data is written in the selected cell C.

In the reset write mode, the reset activation control signal Reset_con is activated at a high level. The write enabling signal We remains activated at the high level, and the set activation control signal Set_con remains inactivated at the low level.

When the data of the global input/output line GI/O is reset data, the reset enabling signal Reset_en is activated at a low level. The PMOS transistor P1 is turned on so that the write voltage outputted from the reset write driving unit 40 is transmitted into the input/output line I/O. The reset data is written in the selected cell C.

Figure 7:
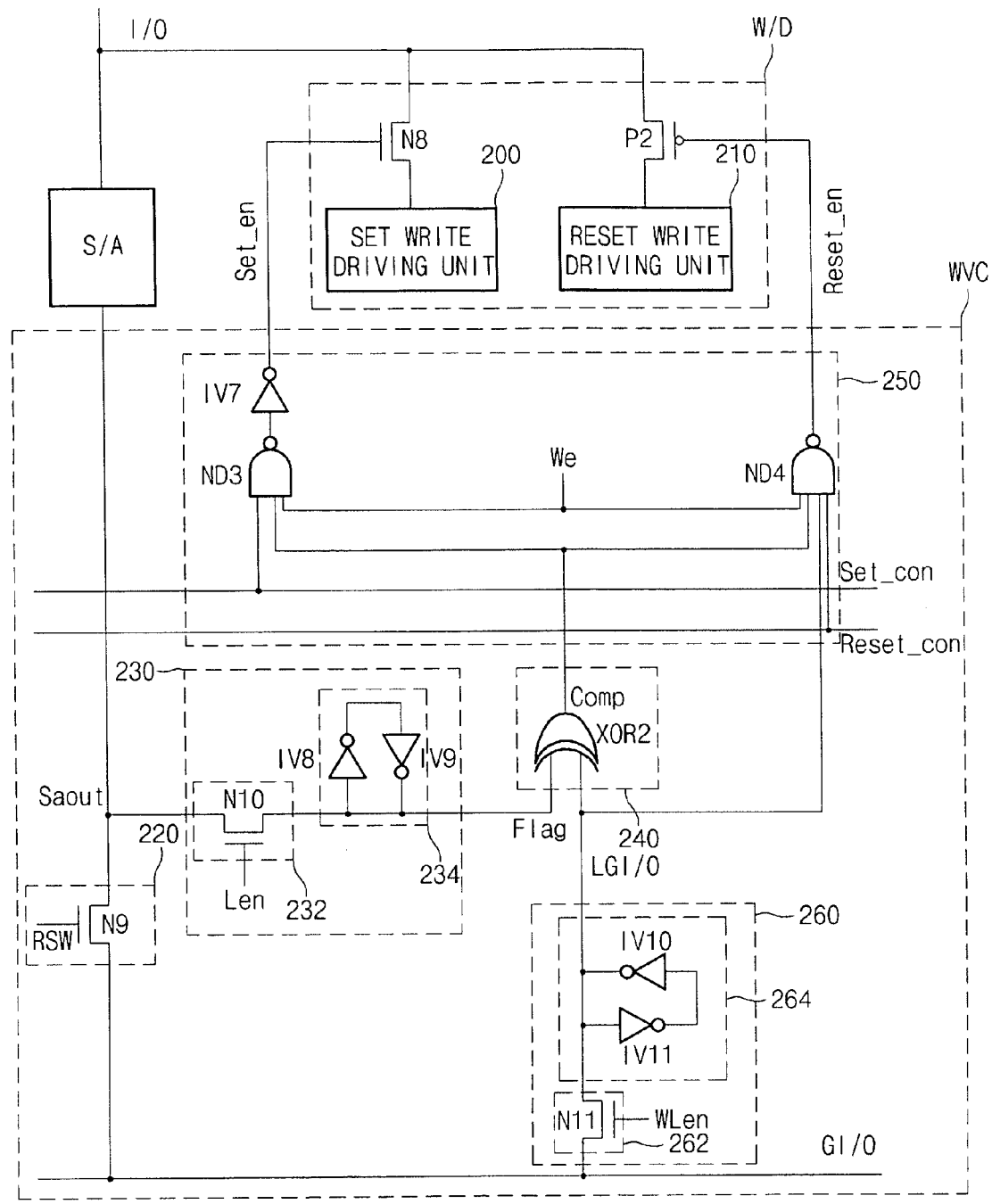
FIG. 7 is a circuit diagram illustrating a sense amplifier, a write driving unit and a write verifying control unit according to an embodiment of the invention.

FIG. 7 is a circuit diagram illustrating a sense amplifier S/A, a write driving unit W/D and a write verifying control unit WVC according to an embodiment of the invention.

The sense amplifier S/A compares a reference current Iref with cell data applied through the input/output line I/O_m to output the output signal Saout.

The write driving unit W/D includes a NMOS transistor N8, a PMOS transistor P2, a set write driving unit 200 and a reset write driving unit 210.

The NMOS transistor N8, connected between the input/output line I/O and the set write driving unit 200, has a gate to receive the set enabling signal Set_en. The PMOS transistor P2, connected between the input/output line I/O and the reset write driving unit 210, has a gate to receive the reset enabling signal Reset_en.

The set write driving unit 200 supplies a write voltage corresponding to set data to the input/output line I/O in a write mode. The reset write driving unit 210 supplies the write voltage corresponding to reset data to the input/output line I/O in the write mode.

The write verifying control unit WVC includes a sense amplifier switching unit 220, a flag register 230, a comparison unit 240, an enabling signal generating unit 250 and a data latch unit 260.

The sense amplifier switching unit 220 includes a NMOS transistor N9. The NMOS transistor N9, connected between an output Saout receiving terminal of the sense amplifier S/A and the global input/output line GI/O, has a gate to receive a read switching signal RSW.

The flag register 230 includes a transfer unit 232 and a latch 234. The transfer unit 232 includes a NMOS transistor N1. The NMOS transistor N1, connected between the output Saout receiving terminal of the sense amplifier S/A and the latch 234, has a gate to receive a latch enabling signal Len.

The latch 234 includes inverters IV8 and IV9. The inverter IV8 inverts an output signal of the transfer unit 232. The inverter IV9 inverts an output signal of the inverter IV8 to output a flag signal Flag.

The comparison unit 240 includes an exclusive OR gate XOR2. The exclusive OR gate XOR2 performs an exclusive OR operation on the flag signal Flag and data of a latch global input/output line LGI/O to output a comparison signal Comp.

The enable signal generating unit 250 includes NAND gates ND3, ND4, and an inverter IV7. The NAND gate ND3 performs a NAND operation on the set activation control signal Set_con, a write enabling signal We and the comparison signal Comp.

The NAND gate ND4 performs a NAND operation on the reset activation control signal Reset_con, data of the glable input/output line GI/O, the write enabling signal We and the comparison signal Comp to output the reset enabling signal Reset_en.

The inverter IV7 inverts an output signal of the NAND gate ND3 to output the set enabling signal Set_en.

The data latch unit 260 includes a transfer unit 262 and a latch 264. The transfer unit 262 includes a NMOS transistor N11. The NMOS transistor N1, connected between the latch 264 and the global input/output line GI/O, has a gate to receive a write latch enabling signal WLen.

The latch 264 includes inverters IV10 and IV11. The inverter IV10 inverts an output signal of the inverter IV11 to output the output signal to the latch global input/output line LGI/O. The inverter IV11 inverts an output signal of the transfer 262.

Table 3 shows the operations of the sense amplifier S/A, the write driving unit W/D and the write verifying control unit WVC.

TABLE 3

| Global input/output line GI/O | Flag signal Flag | Comparison signal Comp | Set enabling signal Set_en | Reset enabling signal Reset_en |
|---|---|---|---|---|
| Set data | Set data | 0 | Inactivated | Inactivated |
| Reset data | Reset data | 0 | Inactivated | Inactivated |
| Set data | Reset data | 1 | Activated | Inactivated |
| Reset data | Set data | 1 | Activated | Activated |

When data of the selected cell C is transmitted into the input/output line I/O, the sense amplifier S/A senses and amplifies data of the selected cell C to output the output signal Saout. A read switching signal RSW remains inactivated at a low level. As a result, the NMOS transistor N8 maintains a turn-off state.

The latch enabling signal Len becomes activated at a high level. The NMOS transistor N9 is turned on so that an output signal Saout of the sense amplifier S/A is transmitted into the latch 234. The latch 234 latches the output signal Saout of the sense amplifier to output signal the flag signal Flag.

The write latch enabling signal WLen is activated at a high level. The NMOS transistor N11 is turned on, the data of the global input/output line GI/O is transmitted into the latch 264. The latch 264 latches the data of the global input/output line GI/O to output the data to the latch global input/output line LGI/O.

The exclusive OR gate XOR2 performs an exclusive OR operation on the flag signal Flag and the data of the latch global input/output line LGI/O to output the comparison signal Comp. When the data of the latch global input/output line LGI/O is the same as the flag signal Flag, the comparison signal Comp is outputted at a low level. When the data of the latch global input/output line LGI/O is different from the flag signal Flag, the comparison signal Comp is outputted at a high level.

When the comparison signal Comp is outputted at the low level, the set enabling signal Set_en is inactivated at a low level and the reset enabling signal Reset_en is inactivated at a high level. The write voltage outputted from the set write driving unit 200 and the reset write driving unit 210 is not applied to the input/output line I/O. When the data stored in the selected cell C is the same as the data to be written, a new write operation is not performed but a write cycle is finished, thereby reducing the number of write operations of the reset and set modes.

When the comparison signal Comp is outputted at a high level, the set write operation and the reset write mode operation are performed simultaneously. That is, the set activation control signal Set_con and the reset activation control signal Reset_con are activated at a high level. The write enabling signal We remains activated at the high level.

When the data of the global input/output line GI/O is set data, the set enabling signal Set_en is activated at a high level, and the reset enabling signal Reset_en is inactivated at a high level. As a result, the NMOS transistor N8 is turned on so that the write voltage outputted from the set write driving unit 200 is transmitted into the input/output line I/O. The set data is written in the selected cell C.

When the data of the global input/output line GI/O is reset data, the reset enabling signal Reset_en is activated at a low level. The set enabling signal Set_en is activated at a high level. The NMOS transistor N8 and the PMOS transistor P2 are turned on so that the write voltage outputted from the reset write driving unit 200 and the reset write driving unit 210 is transmitted into the input/output line I/O. The reset data is written in the selected cell C.

Figure 8:
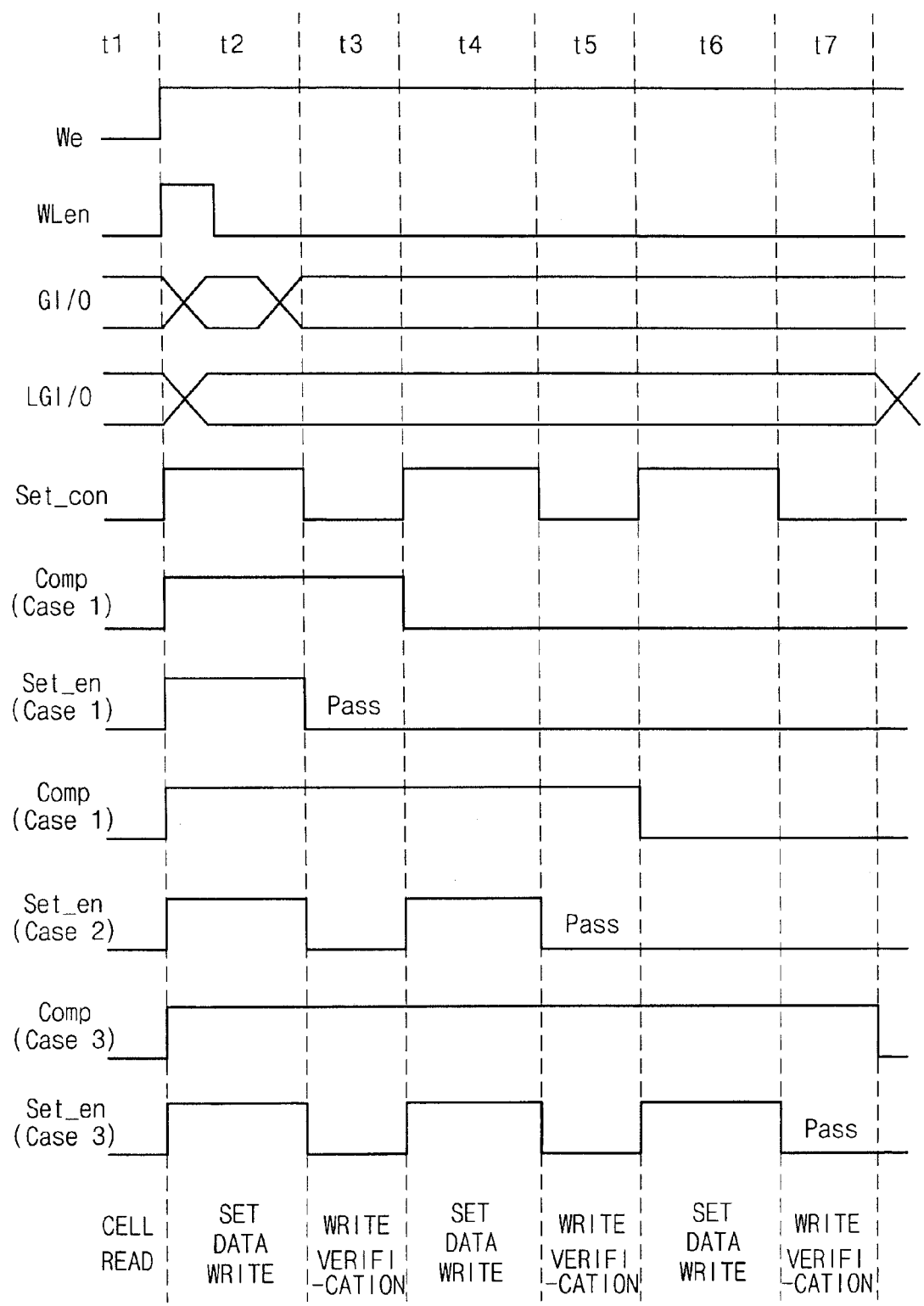
FIG. 8 is a timing diagram illustrating a set write mode according to an embodiment of the invention.

FIG. 8 is a timing diagram illustrating a set write mode according to an embodiment of the invention.

In a period t1, the data of the selected cell C is read. That is, the sense amplifier S/A senses and amplifies the data of the selected cell C to output signal the output signal Saout. The flag register 60 latches the output signal Saout of the sense amplifier S/A to output the flag signal Flag. The write enabling signal We remains inactivated at the low level, and the set activation control signal Set_con remains inactivated at the low level.

In a period t2, when the write cycle starts, the write enable signal We is activated at a high level. The set data is transmitted into the global input/output line GI/O. The write latch enabling signal WLen is activated at a high level so that the set data is latched by the data latch unit 90 and transmitted into the latch global input/output line LGI/O.

The comparison unit 70 compares the flag signal Flag with the set data of the latch global input/output line LGI/O.

When the set data of the latch global input/output line LGI/O is the same as the flag signal Flag, the comparison signal Comp is inactivated at a low level, and the set enabling signal Set_en is inactivated at a low level.

When the set data of the latch global input/output line LGI/O is different from the flag signal Flag, the comparison signal Comp is activated at a high level. In Case 1 when the comparison signal Comp is activated during the periods t2, t3, the set enabling signal Set_en is activated at a high level only during the period t2. As a result, the write voltage is transmitted into the selected unit cell C through the set write driving unit 30 during the period t2.

A period t3 verifies whether the set data is normally written in the selected unit cell C. The data of the unit cell C is read through the sense amplifier S/A. The data Saout read in the selected unit cell C is latched by the flag register 60, and the flag signal Flag is outputted.

The comparison unit 70 compares the flag signal Flag with the set data of the latch global input/output line LGI/O. The set activation control signal Set_con remains inactivated.

When the flag signal Flag is the same as the data of the latch global input/output line LGI/O, the set enabling signal Set_en is inactivated. That is, in Case 1, the write cycle is finished when the set data is under a pass condition.

When the flag signal Flag is different from the set data of the latch global input/output line LGI/O, Case 2 is applied to write the set data. That is, the comparison signal Comp remains activated during periods t2, t3, t4, t5. The set enabling signal Set_en is activated at a high level only during the periods t2, t4.

The write voltage is transmitted into the selected cell C through the set write driving unit 30 during the periods t2, t4.

A period t5 verifies whether the set data is normally written in the selected unit cell C. In Case 2, the write cycle is finished when the set data is under the pass condition. Case 3 is applied when the set data is under a fail condition.

In the write mode, the activation period of the set enabling signal Set_en is changed to write the set data in the selected cell C. Also, an operation for verifying whether the set data is normally written is performed repeatedly. The write and verifying operations increase the activation period of the set enabling signal Set_en until the set data is normally written.

Figure 9:
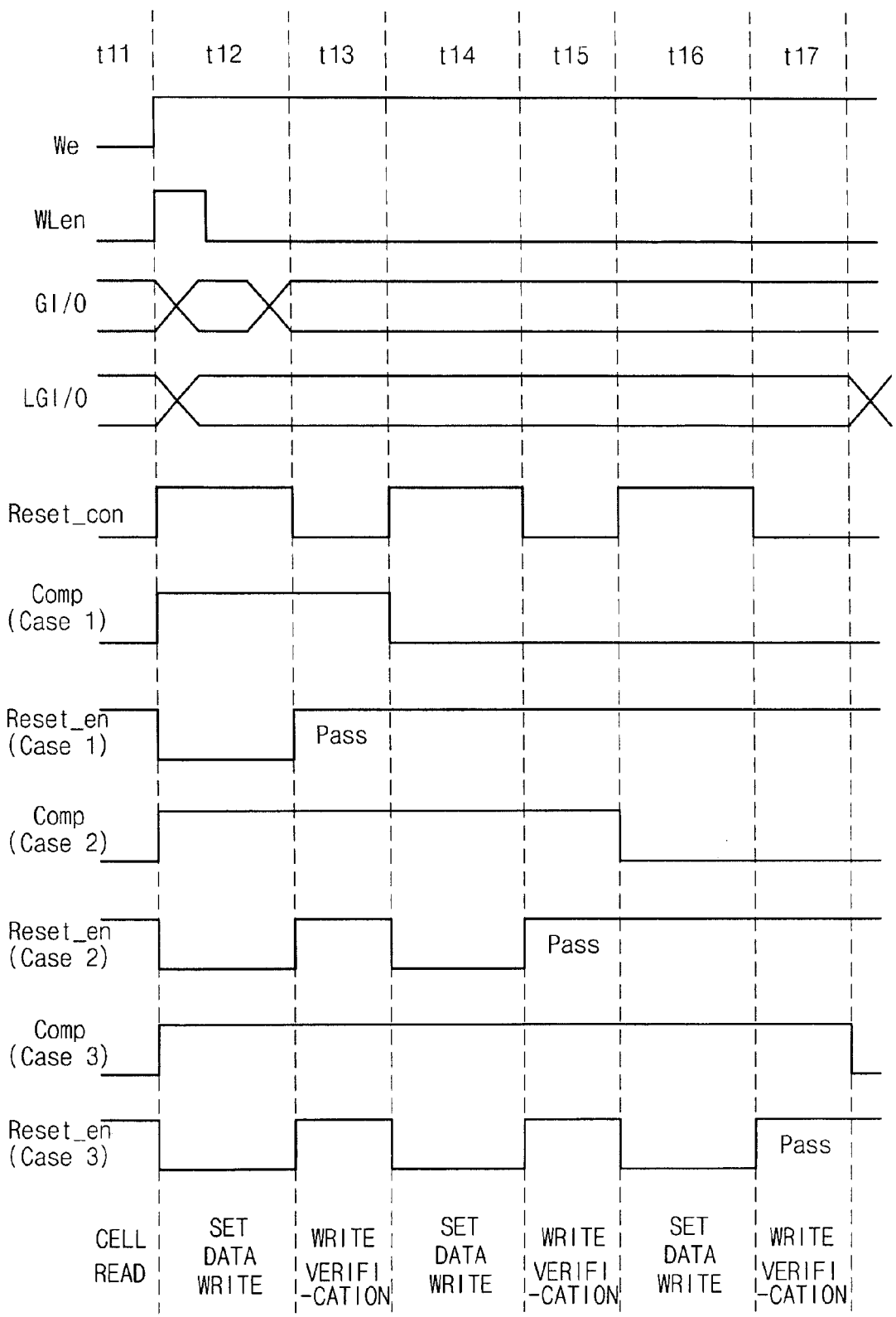
FIG. 9 is a timing diagram illustrating a reset write mode according to an embodiment of the invention.

FIG. 9 is a timing diagram illustrating a reset write mode according to an embodiment of the invention. In a period t11, the data of the selected cell C is read. That is, the sense amplifier S/A senses and amplifies the data of the selected cell C to output signal the output signal Saout. The flag register 60 latches the output signal Saout of the sense amplifier S/A to output the flag signal Flag. The write enabling signal We remains inactivated at the low level, and the reset activation control signal Reset_con remains inactivated at the low level.

In a period t12, when the write cycle starts, the write enabling signal We is activated at a high level. The reset data is transmitted into the global input/output line GI/O. The write latch enabling signal WLen is activated at a high level so that the reset data is latched by the data latch unit 90 and transmitted into the latch global input/output line LGI/O.

The comparison unit 70 compares the flag signal Flag with the reset data of the latch global input/output line LGI/O.

When the reset data of the latch global input/output line LGI/O is the same as the flag signal Flag, the comparison signal Comp is inactivated at a low level, and the reset enabling signal Reset_en is inactivated at a low level.

When the reset data of the latch global input/output line LGI/O is different from the flag signal Flag, the comparison signal Comp is activated at a high level. In Case 1 when the comparison signal Comp is activated during the periods t12, t13, the reset enabling signal Reset_en is activated at a high level only during the period t12. As a result, the write voltage is transmitted into the selected unit cell C through the reset write driving unit 40 during the period t12.

A period t13 verifies whether the reset data is normally written in the selected unit cell C. The data of the unit cell C is read through the sense amplifier S/A. The data Saout read in the selected unit cell C is latched by the flag register 60, and the flag signal Flag is outputted.

The comparison unit 70 compares the flag signal Flag with the reset data of the latch global input/output line LGI/O. The reset activation control signal Reset_con remains inactivated.

When the flag signal Flag is the same as the reset data of the global input/output line GI/O, the reset enabling signal Reset_en is inactivated. That is, in Case 1, the write cycle is finished when the set data is under a pass condition.

When the flag signal Flag is different from the reset data of the latch global input/output line LGI/O, Case 2 is applied to write the set data. That is, the comparison signal Comp remains activated during periods t12, t13, t14, t15. The reset enabling signal Reset_en is activated at a high level during the periods t12, t14.

The write voltage is transmitted into the selected cell C through the reset write driving unit 40 during the periods t12, t14.

A period t15 verifies whether the reset data is normally written in the selected unit cell C. In Case 2, the write cycle is finished when the reset data is under the pass condition. Case 3 is applied when the reset data is under a fail condition.

In the write mode, the activation period of the reset enabling signal Reset_en is changed to write the reset data in the selected cell C. Also, an operation for verifying whether the reset data is normally written is performed repeatedly. The write and verifying operations increase the activation period of the reset enabling signal Reset_en until the reset data is normally written.

Figure 10:
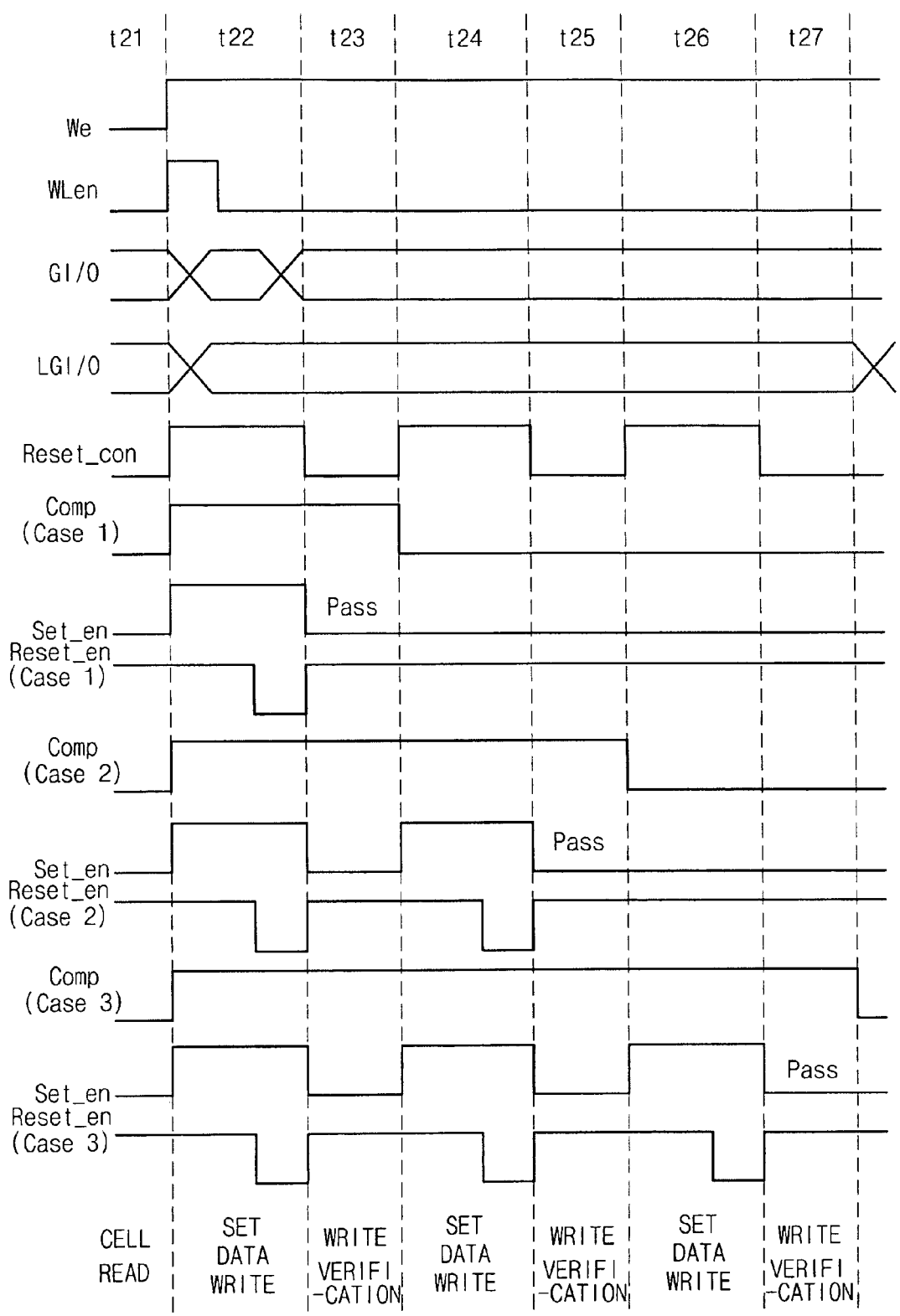
FIG. 10 is a timing diagram illustrating a reset write mode according to an embodiment of the invention.

FIG. 10 is a timing diagram illustrating a reset write mode according to an embodiment of the invention. In a period t21, the data of the selected cell C is read. That is, the sense amplifier S/A senses and amplifies the data of the selected cell C to output signal the output signal Saout. The flag register 230 latches the output signal Saout of the sense amplifier S/A to output the flag signal Flag. The write enabling signal We remains inactivated at the low level, and the set activation control signal Set_con and reset activation control signal Reset_con remain inactivated at the low level.

In a period t22, when the write cycle starts, the write enabling signal We is activated at a high level. The reset data is transmitted into the global input/output line GI/O. The write latch enabling signal WLen is activated at a high level so that the reset data is latched by the data latch unit 260 and transmitted into the latch global input/output line LGI/O.

The comparison unit 240 compares the flag signal Flag with the reset data of the latch global input/output line LGI/O.

When the reset data of the latch global input/output line LGI/O is the same as the flag signal Flag, the comparison signal Comp is inactivated at a low level, and the reset enabling signal Reset_en is inactivated at a low level.

When the reset data of the latch global input/output line LGI/O is different from the flag signal Flag, the comparison signal Comp is activated at a high level. In Case 1 when the comparison signal Comp is activated during the periods t22, t23, the set enabling signal Set_en is activated at the high level only during the period t22. The reset enabling signal Reset_en is activated at a low level after a given time.

Through the set write driving unit 200 and the reset write driving unit 210, the write voltage is transmitted into the selected unit cell C during the period t22. The write voltage has an twice increased voltage level while the set enabling signal Set_en and the reset enabling signal Reset_en are activated simultaneously.

A period t23 verifies whether the reset data is normally written in the selected unit cell C. The data of the unit cell C is read through the sense amplifier S/A. The data Saout read in the selected unit cell C is latched by the flag register 230, and the flag signal Flag is outputted.

The comparison unit 240 compares the flag signal Flag with the reset data of the latch global input/output line LGI/O. The reset activation control signal Reset_con is inactivated.

When the flag signal Flag is the same as the reset data of the global input/output line GI/O, the reset enabling signal Reset_en is inactivated. That is, in Case 1, the write cycle is finished when the set data is under a pass condition.

When the flag signal Flag is different from the reset data of the latch global input/output line LGI/O, Case 2 is applied to write the set data. That is, the comparison signal Comp remains activated during periods t22, t23, t24, t25.

The set enabling signal Set_en is activated at the high level only during the periods t22, t24. The reset enabling signal Reset_en is activated at the low level after a given time.

Through the set write driving unit 200 and the reset write driving unit 210, the write voltage is transmitted into the unit cell C during the periods t22, t24.

A period t25 verifies whether the reset data is normally written in the selected unit cell C. In Case 2, the write cycle is finished when the reset data is under the pass condition. Case 3 is applied when the reset data is under a fail condition.

In the write mode, the activation period of the reset enabling signal Reset_en is changed to write the reset data in the selected cell C. Also, an operation for verifying whether the reset data is normally written is performed repeatedly. The write and verifying operations increase the activation period of the set enabling signal Set_en and the reset enabling signal Reset_en until the reset data is normally written.

As described above, according to an embodiment of the invention, a phase change memory device is configured to perform a write verifying operation so as to write data stably in cells, to control write modes of set and reset states, respectively, and to share a set write driving unit in a write mode of the reset state so as to reduce power consumption.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A phase change memory device comprising:
   a cell array unit including a phase change resistance cell disposed in a region where a word line and a bit line are crossed;
   a sense amplifier configured to sense and amplify data of the phase change resistance cell;
   a write verifying control unit controlled by an activation control signal and configured to compare data read through the sense amplifier with the data to be written so as to output a set enabling signal and a reset enabling signal;
   a set write driving unit configured to supply a write voltage corresponding to set data to the cell array unit in response to the set enabling signal; and
   a reset write driving unit configured to supply a write voltage corresponding to reset data to the cell array unit in response to the reset enabling signal.

2. The phase change memory device according to claim 1, wherein the write verifying control unit outputs the set enabling signal and the reset enabling signal to be inactivated when the data read through the sense amplifier are the same as the data to be written.

3. The phase change memory device according to claim 1, wherein the write verifying control unit changes an activation period of the set enabling signal and the reset enabling signal when the data read through the sense amplifier are different from the data to be written.

4. The phase change memory device according to claim 3, wherein the write verifying control unit increases sequentially the activation period of the set enabling signal and the reset enabling signal when the data read through the sense amplifier are different from the data to be written.

5. The phase change memory device according to claim 1 further comprising:
   a first switching element connected between the cell array unit and the set write driving unit and configured to receive the set enabling signal through a gate.

6. The phase change memory device according to claim 5 further comprising:
   a second switching element connected between the cell array unit and the reset write driving unit and configured to receive the reset enabling signal through a gate.

7. The phase change memory device according to claim 1, wherein the write verifying control unit comprises:
   a flag register configured to latch the data read through the sense amplifier;
   a comparison unit configured to compare an output signal of the flag register with the data to be written; and
   an enabling signal generating unit configured to perform a logic combination on the activation control signal, an output signal of the comparison unit and the data to be written so as to output the set enabling signal and the reset enabling signal.

8. The phase change memory device according to claim 7, wherein the flag register comprises:
   a transfer unit configured to transfer the data read through the sense amplifier in response to a latch enabling signal; and
   a latch configured to latch an output signal of the transfer unit.

9. The phase change memory device according to claim 8, wherein the transfer unit comprises a MOS transistor connected between the sense amplifier and the latch and configured to receive the latch enabling signal through a gate.

10. The phase change memory device according to claim 7, wherein the comparison unit comprises a first logic combination unit configured to inactivate a comparison signal when the output signal of the flag register is the same as the data to be written, and to activate the comparison signal when the output signal of the flag register is different from the data to be written.

11. The phase change memory device according to claim 10, wherein the first logic combination unit is an exclusive OR gate.

12. The phase change memory device according to claim 7, wherein the enabling signal generating unit comprises:
    a second logic combination unit configured to perform a logic combination on a set activation control signal, the output signal of the comparison unit, the data to be written and a write enabling signal so as to output the set enabling signal; and
    a third logic combination unit configured to perform a logic combination on a reset activation control signal, the output signal of the comparison unit, the data to be written, and the write enabling signal, so as to output the reset enabling signal.

13. The phase change memory device according to claim 12, wherein the second logic combination unit comprises:
    a first NAND gate configured to perform a NAND operation on the set activation control signal, the output signal of the comparison unit, the data to be written, and the write enabling signal; and
    a first inverter configured to invert an output signal of the first NAND gate.

14. The phase change memory device according to claim 12, wherein the third logic combination unit comprises:
    a second NAND gate configured to perform a NAND operation on the reset activation control signal, the output signal of the comparison unit, the data to be written, and the write enabling signal; and
    a second inverter configured to invert an output signal of the second NAND gate.

15. The phase change memory device according to claim 7, wherein the enabling signal generating unit comprises:
    a fourth logic combination unit configured to perform a logic combination on a set activation control signal, the output signal of the comparison unit and a write enabling signal so as to output the set enabling signal; and
    a fifth logic combination unit configured to perform a logic combination on a reset activation control signal, the output signal of the comparison unit, the data to be written and the write enabling signal so as to output the reset enabling signal.

16. The phase change memory device according to claim 15, wherein the fourth logic combination unit comprises:
- a third NAND gate configured to perform a NAND operation on the set activation control signal, the output signal of the comparison unit, and the write enabling signal; and
- a third inverter configured to invert an output signal of the third NAND gate.

17. The phase change memory device according to claim 15, wherein the fifth logic combination unit comprises:
- a fourth NAND gate configured to perform a NAND operation on the reset activation control signal, the output signal of the comparison unit, the data to be written, and the write enabling signal; and
- a fourth inverter configured to invert an output signal of the fourth NAND gate.

18. The phase change memory device according to claim 7, wherein the write verifying control unit further comprises a sense amplifier switching unit configured transmit an output signal of the sense amplifier to a global input/output line in response to a read switching signal.

19. The phase change memory device according to claim 7, wherein the write verifying control unit comprises:
- a transfer unit configured to transfer data of a global input/output line in response to write latch enabling signal; and
- a latch configured to latch an output signal of the transfer unit.

20. The phase change memory device according to claim 1, wherein the phase change resistance cell comprises:
- a phase change resistance element configured to sense a crystallization state changed depending on a current, so as to store data corresponding to resistance change; and
- a diode element connected between the phase change resistance element and the word line.

* * * * *